United States Patent [19]
Hamaguchi

[11] Patent Number: 5,644,138
[45] Date of Patent: Jul. 1, 1997

[54] ELECTRON BEAM EXPOSURE APPARATUS AND A METHOD FOR ELECTRON BEAM EXPOSURE

[75] Inventor: Shin-ichi Hamaguchi, Kawasaki, Japan

[73] Assignee: Fujitsu Limited, Kawasaki, Japan

[21] Appl. No.: 300,862

[22] Filed: Sep. 6, 1994

[30] Foreign Application Priority Data

Sep. 9, 1993 [JP] Japan .................... 5-224465

[51] Int. Cl.$^6$ .................................... H01J 37/302
[52] U.S. Cl. .................................... 250/492.22
[58] Field of Search .................... 250/398, 492.2, 250/492.22

[56] References Cited

U.S. PATENT DOCUMENTS

| | | | |
|---|---|---|---|
| 4,520,269 | 5/1985 | Jones | 250/492.2 |
| 4,943,729 | 7/1990 | Ando et al. | 250/398 |
| 5,082,762 | 1/1992 | Takahashi | 430/296 |
| 5,210,696 | 5/1993 | Yano | 250/492.2 |
| 5,278,419 | 1/1994 | Takahashi et al. | 250/492.2 |
| 5,305,225 | 4/1994 | Yamaguchi et al. | 250/398 |
| 5,369,282 | 11/1994 | Arai et al. | 250/492.22 |
| 5,430,304 | 7/1995 | Yasuda et al. | 250/492.22 |
| 5,448,075 | 9/1995 | Fueki et al. | 250/492.22 |

*Primary Examiner*—Bruce C. Anderson
*Attorney, Agent, or Firm*—Armstrong, Westerman, Hattori, McLeland & Naughton

[57] ABSTRACT

An electron beam exposure apparatus comprising: exposure computing means for outputting main-exposure data and sub-exposure data, the former of which expose non-reversal image area of a depiction pattern, the other of which expose reversal image area of the depiction pattern respectively; and electron beam optics means for emitting electron beams and deflecting thereof onto workpiece to be exposed according to the main exposure data and sub-exposure data from the exposure computing means.

5 Claims, 6 Drawing Sheets

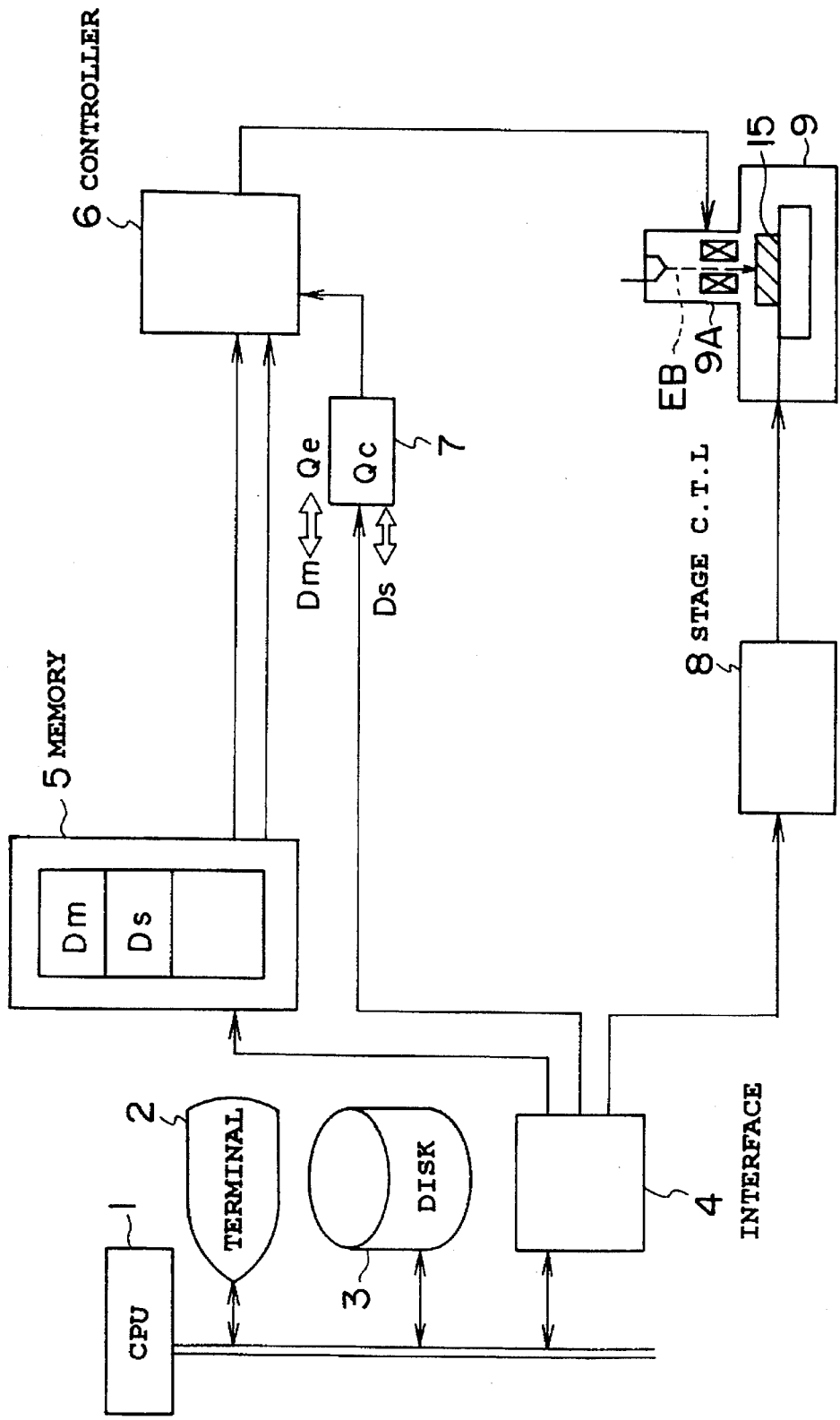

(RELATED ART)

ELECTRON BEAM EXPOSURE APPARATUS AND A METHOD FOR ELECTRON BEAM EXPOSURE

BACKGROUND OF THE INVENTION

1. Field of the Invention

The present invention relates to an electron beam exposure apparatus and electron beam exposure method, more particularly to an improvement of function and method for correcting proximity effect when exposing pattern of semiconductor circuit of large scale integration (referred to as LSI hereinafter).

2. Description of the Related Art

Recently, as the integration density of LSI devices has been increased, there is required technology which may provide the exposure of fine pattern of less than 0.1 μm at high resolution. For example, when forming a device pattern onto a semiconductor wafer, photo-transfer technology with ultraviolet light is used.

In accordance with the photo-transfer technology mentioned above, a mask or a reticle made of an original drawing magnified about 5 times is used for a master. In the mask forming process of this case, a dry plate is formed first. A dry plate is made by a glass substrate, on which metal layer is spattered or deposited for opaque layer. Then resist for electron beam is applied thereon, and the substrate is baked. The plate is selectively radiated with electron beam and etched. Then additional processes such as peeling off residual resist are done. Thus, a mask (reticle) is formed by selectively removing metal layer from the substrate.

However, in the electron beam exposure, the emitted electrons penetrating into the dry plate may diffuse and disperse within the plate. This leads to the phenomenon called "Proximity effect". The proximity effect is caused by the influence of the amount of effective radiation to the area of higher pattern density, as compared with the amount of effective radiation to the independent pattern area within the radiated zone. For example, the proximity effect is caused by the radiated beam of each of the shots superposed on each other in that area.

At this point, the related arts of the present invention will be described. For example, as depicted in FIG. 1, an apparatus for carrying out "GHOST exposure method" for correcting the proximity effect, comprises a CPU 1, terminal unit 2, magnetic disk 3, interface 4, buffer memory 5, beam control system 6, register for dose 7, stage driving system 8, and Electron beam optics 9.

In the operation of said apparatus, when at first an exposure instruction is entered through terminal unit 2, main exposure data Dm and sub-exposure data Ds are read out from magnetic disk 3, these data are stored in the buffer memory 5 via interface 4. Then, data Dm which determines the amount of dose Qe in the most appropriate focus (just focus) is set to register 7, and the exposure is done in accordance with this data. After having exposed with this data Dm (simply referred to as Dm exposure, hereinafter), another dose amount Qc for the sub-exposure pattern Ds is set to register 7 to make another exposure with data Ds (hereinafter, Ds exposure).

By this, LSI pattern is exposed onto the exposed workpiece 15 according to the main exposure data Dm and sub-exposure data Ds. The exposure with sub-exposure data Ds is used for correcting the proximity effect.

The principle of this method is to form a reversal image ("back ground") of the main exposure data ("primary pattern"). That is, supplying to the auxiliary pattern as shown in FIG. 2A (height H×width W) electron beam EB in which the dose amount of from 30 to 40% of the dose amount of the main exposure is shade off by a predetermined amount. More practically, adjusting the coil current which is supplied to the object lens 9A of the electron beam optics 9 to defocus, thereby maintaining the energy for the back ground to a given level to obtain a desired and uniform pattern size.

According to a paper entitled "proximity effect correction for electron beam lithography by equalization of background dose" by G. Owen and P. Rissman, appeared on J. Appl. Phys., 54, 3573 (1983), following equation is given:

$$Qc = Qe \times \eta_e (1+\eta_e)^{-1},$$

$$dc = 2\sigma_b \times (1+\eta_e)^{-1/2}$$

Where $\eta_e$ is the ratio between the energy stored in the resist layer by backward diffused electrons and that by front diffused electrons; Qe is the amount of dose for pattern exposure; Qc is the amount of dose for supplying to the reversal image area of the pattern in order to correct the proximity effect; $\sigma_b$ is the radius at which the energy stored in the resist layer by the backward diffused electrons gets 1/e of its peak value (e=Euler constant); dc is the shaded beam radius at the moment of exposure of the reversal image area for correction.

In the above-mentioned paper, a set of values of $\eta_e = 0.73$, Qc/Qe=0.43, and dc=3.2 μm is cited as an example.

SUMMARY OF THE INVENTION

An object of the present invention is to provide high speed exposure process and improved yields of manufacturing by providing a series of exposures of main and sub-exposure always settled to most appropriate (just) focus to correct proximity effect similar to "GHOST exposure method" (the GHOST method is a registered trade mark of Hewlett-Packard, Co.).

Thus, an electron beam exposure apparatus of the present invention, of which one of preferred embodiments is shown in FIG. 3, is an apparatus for exposure process by emitting electron beam to exposed workpiece, comprising exposure computing means for outputting main-exposure data and sub-exposure data, the former of which expose non-reversal image area of a depiction pattern, the other of which expose reversal image area of the depiction pattern respectively; and electron beam optics means for emitting electron beams and deflecting thereof onto workpiece to be exposed according to the main exposure data and sub-exposure data from the exposure computing means.

Therefore, in the main exposure mode, dose data for main exposure is read out to thereby deflect electron beam to give a main exposure process. When the mode is switched from main to sub-exposure mode, dose data for sub-exposure and data for its pattern shift are read out with the most appropriate focus unchanged. The sub-exposure is processed based on these data. Thus, a series of exposure process of main and sub-exposure may be carried out, with the most appropriate (just) focus unchanged.

In addition, the method of electron beam exposure in accordance with the present invention is a method for exposing to exposed workpiece by emitting deflected electron beam to said exposed workpiece based on both main and sub-exposure data, comprising the steps of selecting one of main-exposure data and sub-exposure data, the former of which expose non-reversal image area of depiction pattern, the other of which expose reversal image area of depiction pattern respectively; and emitting electron beams and deflecting thereof onto workpiece to be exposed according to the main exposure data and sub-exposure data.

Therefore, by controlling the deflection of electron beam by means of the different data selected corresponding to one of both modes, the correction of proximity effect similar to said "GHOST exposure method" may be carried out, without relying on the shading process of electron beam of the related art of the present invention as above mentioned.

Thus, with the present invention, the performance of electron beam exposing apparatus for exposing extremely fine pattern of less than 0.1 μm at high resolution is allowed to be improved, and the speed-up of exposure process may be achieved. Also, this may lead to improved production yields of high density semiconductor integrated circuit devices.

BRIEF DESCRIPTION OF THE DRAWINGS

FIG. 1 is a block diagram of an electron beam exposure apparatus according to the related art;

DETAILED DESCRIPTION OF THE INVENTION

Figure 2A:
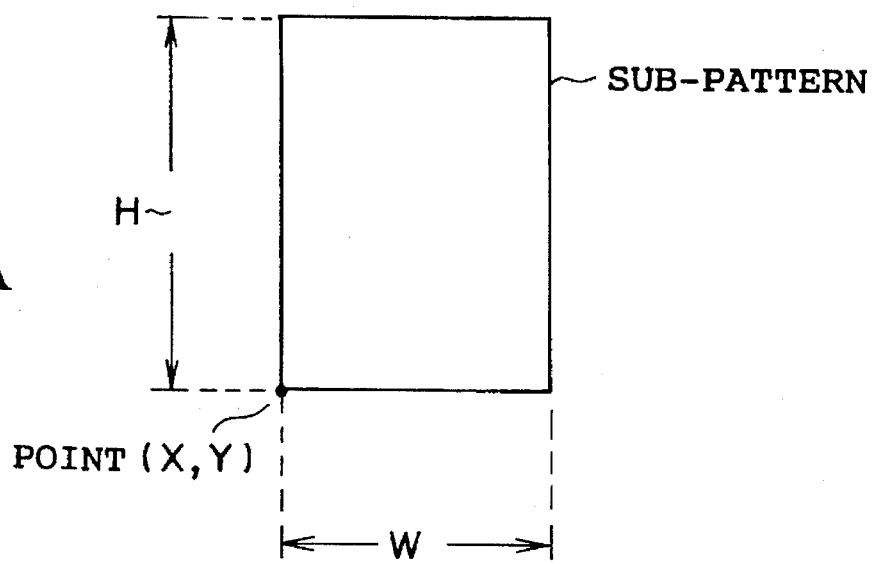
FIG. 2A is a schematic diagram of auxiliary pattern (height H×width W) illustrating problems of the electron beam exposure apparatus shown in FIG. 1.
Figure 2B:
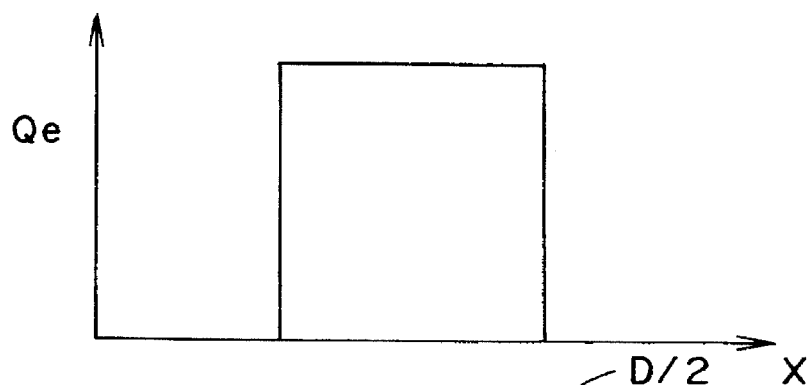
FIG. 2B is a distributional map of dose amount illustrating problems of the electron beam exposure apparatus shown in FIG. 1.
Figure 2C:
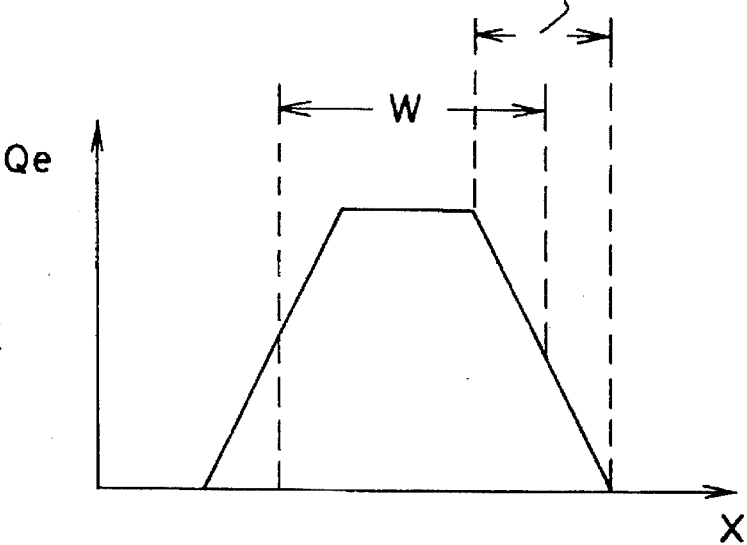
FIG. 2C is a distributional map of beam energy illustrating problems of the electron beam exposure apparatus shown in FIG. 1.

According to the method of proximity effect correction by the related art of the present invention, beam energy distribution (Gaussian distribution) as shown in FIG. 2C can be obtained by emitting to exposed workpiece 15 the shaded dose amount of electron beam EB decreased 30 to 40% of the amount of main exposure.

However, in sub-exposure process, if electron beam EB is shaded out by for example defocusing object lens 9A of Electron beam optics 9, the characteristics of beam deflection may also be affected. For example, the gain and the rotation value of the beam deflector as shown in FIG. 2A may be altered.

Consequently, at the time of switching from main exposure to sub-exposure, control parameters of electron beam optics registered to the most appropriate focusing point ("just focus") as shown in the distributional map of dose amount in FIG. 2B has to be set again.

Thus, in the "GHOST exposure method" according to the related art of the present invention, various parameters of the electron beam optics must be adjusted after Dm exposure in order to be able to conform to the setting of Ds exposure. The adjustment may not only cause high speed exposure process to slow down, or cause stable exposure to any fine and precise devices to be difficult, but also lead to decrease production yields.

Figure 3:
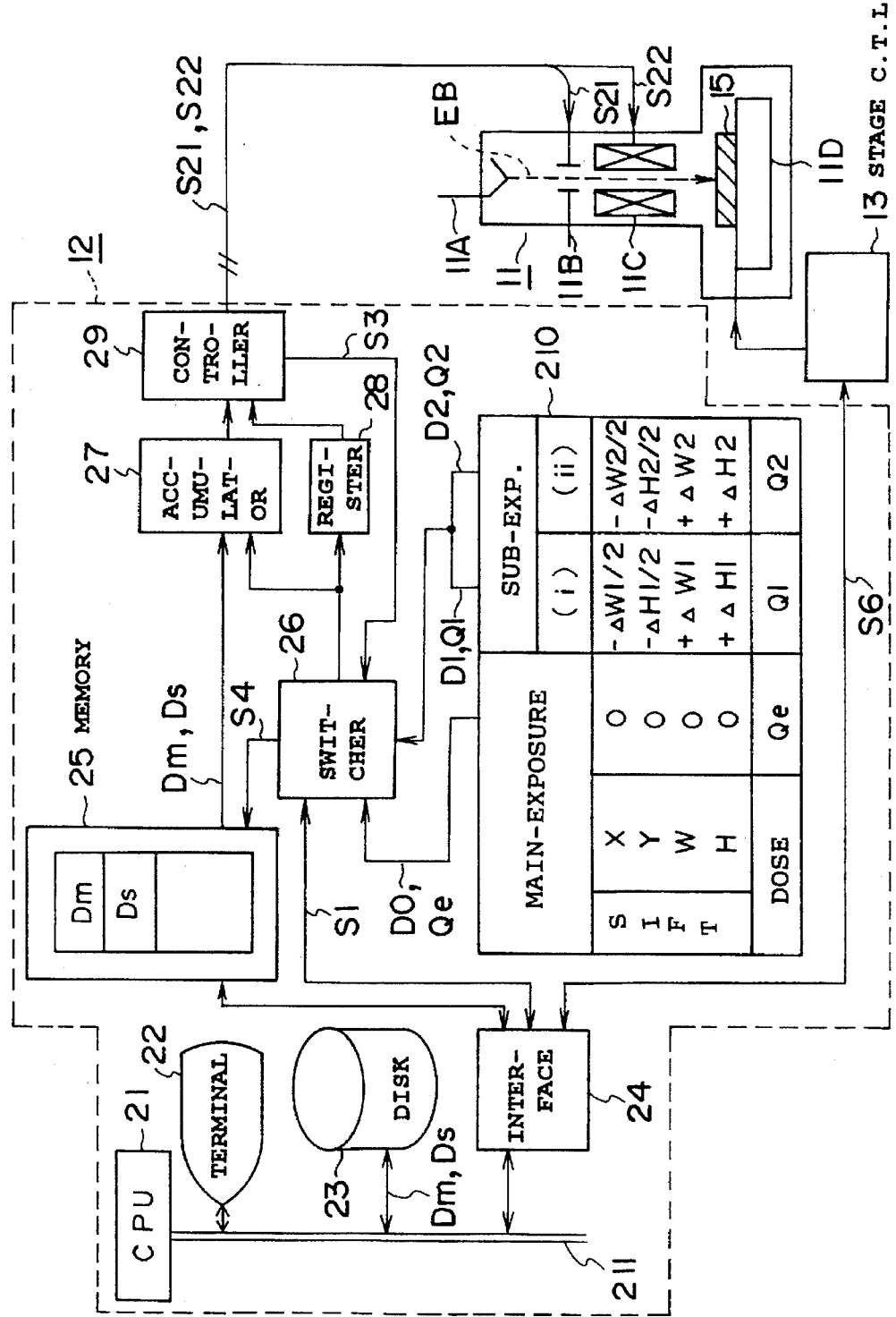
FIG. 3 is a block diagram of an electron beam exposing apparatus according to a preferred embodiment of the present invention.

In contrast, the electron beam exposure apparatus according to the principle of the present invention incorporates, as is shown one of its preferred embodiments in FIG. 3, exposure computing means for outputting main-exposure data and sub-exposure data, the former of which expose non-reversal image area of a depiction pattern, the other of which expose reversal image area of the depiction pattern respectively; and electron beam optics means for emitting electron beams and deflecting thereof onto workpiece to be exposed according to the main exposure data and sub-exposure data from the exposure computing means.

The exposure computing means includes memory means for storing dose amount data and pattern shift amount data which are for emitting electron beams and deflecting onto the reversal image area of the depiction pattern.

The exposure computing means includes memory means for storing dose amount data and pattern shift amount data which are for emitting electron beams and deflecting onto the non-reversal image area of the depiction pattern.

The exposure computing means includes mode selecting means for selecting one of either main exposure mode or sub-exposure mode, the former of which expose non-reversal image area of depiction pattern, the other of which expose reversal image area of depiction pattern.

Figure 4A:
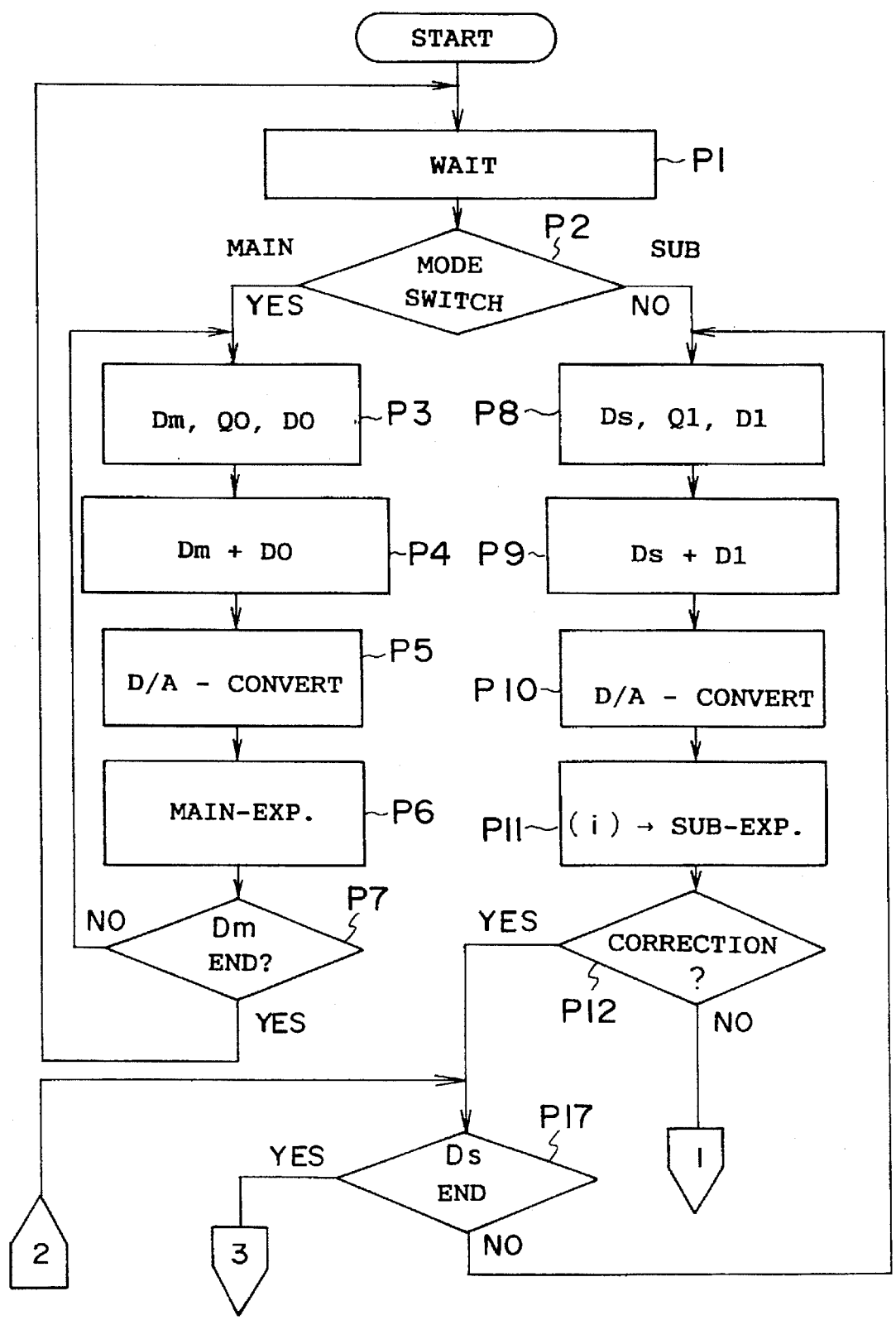
FIG. 4A is a part of flow chart of the process of electron beam exposure according to a preferred embodiment of the present invention.
Figure 4B:
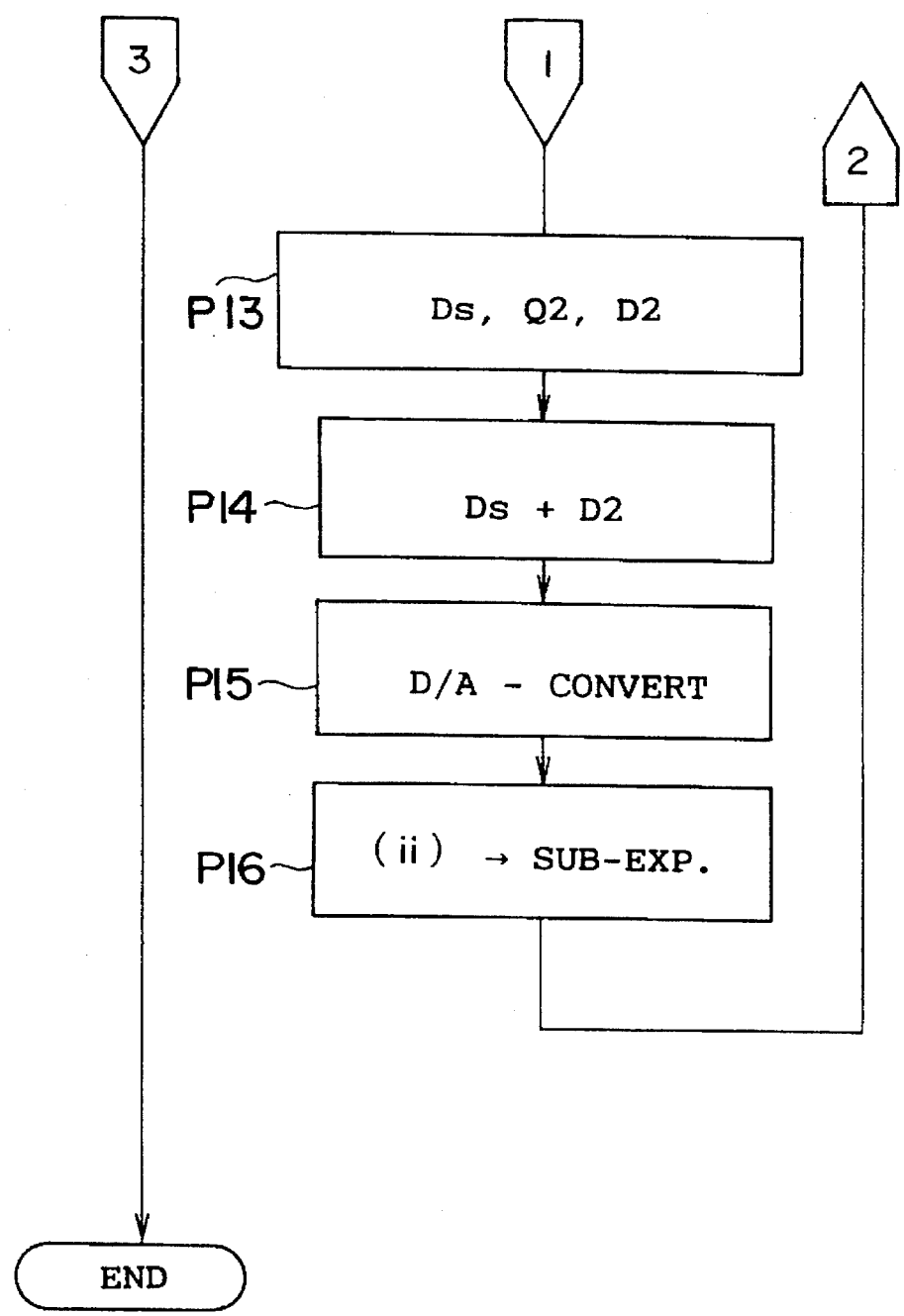
FIG. 4B is another part of flow chart of the process of electron beam exposure according to a preferred embodiment of the present invention.

The method of electron beam exposure according to the present invention incorporates, as is shown one of its preferred embodiments in FIG. 4A and 4B, selecting one of main-exposure data and sub-exposure data, the former of which expose non-reversal image area of depiction pattern, the other of which expose reversal image area of depiction pattern respectively; and emitting electron beams and deflecting thereof onto workpiece to be exposed according to the main exposure data and sub-exposure data.

The method for electron beam exposure according to claim 5, further comprising the step of correcting sub-exposure data by means of more than one set of dose amount data and pattern shift amount data for sub-exposure when the sub-exposure data is selected.

The main exposure data includes dose amount data and pattern shift amount data which are for emitting electron beams and deflecting onto the non-reversal image area of the depiction pattern.

The sub-exposure data includes dose amount data and pattern shift data which are for emitting electron beams and deflecting onto the reversal image area of the depiction pattern.

The operation of the electron beam exposure apparatus according to the principle of the present invention will be now described. For example, in the main exposure mode, data of dose amount for main exposure is read out from memory means, electron beam is deflected by electron beam optics according to that data and main exposure data, to carry out main exposure process.

When the exposure mode is switched from main exposure mode to sub-exposure mode by mode selecting means, data of dose amount for sub-exposure and data for its pattern shift are read out from memory means without altering just focus. At this point, sub-exposure data is corrected by using pattern shift data. Then electron beam is deflected by electron beam optics according to that corrected sub-exposure data and dose data for sub-exposure, to carry out sub-exposure process. In the sub-exposure mode, the sub-exposure data will be corrected according to more than one set of data of dose amount for sub-exposure and data for its pattern shift.

As a result, a series of exposure process of main and sub-exposure always with just focus unchanged, and the correction of proximity effect similar to the "GHOST exposure method" may be achieved.

This allows the correction of proximity effect similar to the "GHOST exposure method" to be carried out without shading process of electron beam.

In addition, according to the electron beam exposure method of the present invention, as shown in a preferred embodiment shown in FIG. 4A and 4B, either data of dose amount for main exposure and data for its pattern shift, or data of dose amount for sub-exposure and data for its pattern shift are respectively selected according to main exposure mode or sub-exposure mode.

In the sub-exposure mode, electron beam deflection may be controlled based on the selected various data, correction dose, and shift to approximate the distribution of beam energy required for sub-exposure and represented by Gaussian distribution by superposing the graded (stepped) function obtained from that set of exposures (beam energy). That is, the correction of proximity effect similar to "GHOST exposure method" according to the related art of the present invention may be carried out.

This allows the pattern exposure to be processed by using electron beam EB registered to the most appropriate focus (just focus) of the electron beam optics based on the control parameters settled at first. Additionally, since adjustment of control parameters is not required at the time of mode switching, high speed exposure process and stable exposure process for high precision devices may be achieved. Also, production yields may be improved.

Next, referring to the drawings, preferred embodiment of the present invention will be described. For example, electron beam exposure apparatus which carries out the proximity effect correction similar to the "GHOST exposure method" comprises, as shown in FIG. 3, electron beam optics 11, exposure computing system 12, and stage driving system 13.

The electron beam optics 11 comprises electron beam gun 11A, blanking deflector 11B, object lens 11C, stage 11D, etc. Electron beam gum 11A emits electron beam EB. Blanking deflector 11B turn on and off electron beam EB according to blanking signal S21. For instance, if signal S21="High" level, the deflector deflects electron beam EB from its optical axis to aperture grill (not shown) to prevent beam from emitting to the exposed workpiece 15. Conversely, if signal S21="Low" level, the deflector bring electron beam EB back to the optical axis to continue beam emission onto the exposed workpiece 15.

The object lens 11C focuses electron beam EB based on focusing Control signal S22. The electron beam optics 11 may additionally comprises electrostatic deflector and electromagnetic deflector. Stage 11C supports exposed workpiece 15.

Exposure computing system 12 comprises CPU 21, terminal unit 22, magnetic disk 23, interface 24, buffer memory 25, Mode switcher 26, Shift accumulator 27, dose register 28, beam control system 29, and shift and dose correcting coefficient memory 210.

CPU 21 is coupled to internal bus 211 and controls input/output to and from terminal unit 22, magnetic disk 23 and interface 24. Terminal unit 22 is for setting exposure mode and instructing the start of exposure sequence. Magnetic disk 23 is a memory for storing main exposure data Dm and sub-exposure data Ds for each of different types of LSI.

Interface 24 inputs/outputs different data of Dm and Ds, and different control signals S1 and S6. Buffer memory 25 is a memory for temporarily storing main exposure data Dm and sub-exposure data Ds for one pattern. For example, buffer memory 25 sends data Dm or data Ds to Shift accumulator 27 according to read-out request signal S4.

Mode switcher 26, which is an example of mode selecting means, comprises MPU (microprocessor) and so on to select either main or sub-exposure mode according to switching control signal S1 and exposure control signal S3. When main exposure mode is selected, mode switcher 26 reads out data of dose amount Qe and data of pattern shift amount D0 from Memory 210. Data Qe will be sent to Dose register 28, and Data D0 to Shift accumulator 27.

When sub-exposure mode is selected, mode switcher 26 reads out data of dose amount Q1, Q2 and data of pattern shift amount D1, D2. Data Q1 and Q2 will be sent to Dose register 28, and data D1 and D2 to Shift accumulator 27.

Shift accumulator 27 adds pattern shift amount data D0 and D1 to main exposure data Dm and sub-exposure data Ds to output data Dm+D0, Ds+D1 or Ds+D2 to electron beam controls system 29. Dose register 28 temporarily stores Dose amount Qe, Q1 and Q2.

Electron beam control system 29 carries out digital-to-analog (D/A) conversion of various data Dm+D0, Ds+D1 or Ds+D2 to output signal S21 and S22 based on D/A converted data to the main deflector 11B or other deflector of electron beam optics 11. Beam control system 29 transmits exposure control signal S3 to mode switcher 26 when an exposure sequence for a pattern has been terminated Shift and dose correction coefficient memory (referred to as simply correction coefficient memory, hereinafter) 210 may be an example of any memory means, and is a memory for storing dose amount data Qe and pattern shift amount data D0 for main exposure, and dose amount data Q1, Q2 and pattern shift amount data D1, D2 for sub-exposure. Data D0 contains the starting point coordinates, P0(X, Y)=(0, 0) and the size of auxiliary pattern, (H, W)=(0, 0).

Data D1 contains the starting point coordinates of electron beam EB, p1(X, Y)=(−ΔW1/2, −ΔH1/2), the size of auxiliary pattern (H, W)=(+ΔW1, +ΔH1). Data D2 contains the starting point coordinates of electron beam EB, p2(X, Y)= (−dW2/2, −dH2/2), the size of auxiliary pattern (h,w)=(+ΔW2, +ΔH2). In a preferred embodiment of the present invention, the stepped functions of the dose amount Q1 and Q2 are superposed with two parameters (i) and (ii).

Stage drive system 13 drives stage 11D in the both X and Y directions, according to drive control signal S6.

In accordance with the electron beam exposure apparatus of the present invention, there are provided, as shown in FIG. 3, electron beam optics 11 and exposure computing system 12, said computing system 12 including mode switcher 26 and correction coefficient memory 210.

Therefore said apparatus may process a series of exposures of main and sub-exposure always with just focus unchanged, and may correct proximity effect similar to the "GHOST exposure method". For example, in the main exposure mode, dose amount data Qe is read out from correction coefficient memory 210, then electron beam EB is deflected by electron beam optics 11 based on that data and main exposure data Dm to carry out main exposure sequence onto exposed workpiece 15.

Also, when mode switcher 26 switches from main exposure mode to sub-exposure mode, dose amount data Q1 and pattern shift amount data D1 for sub-exposure with that parameter (i) are read out from correction coefficient memory 210 while maintaining the just focus. Here, sub-exposure data Ds is corrected by data D1. The corrected sub-exposure data and dose amount data Q1 are used to deflect electron beam EB in the electron beam optics 11 to carry out sub-exposure to the exposed workpiece 15.

After that, dose amount data Q2 and pattern shift amount data D2 for sub-exposure are read out for the parameter (ii). Here, sub-exposure data Ds is corrected by data D2. The corrected sub-exposure data and dose amount data Q2 are used to deflect electron beam EB in the electron beam optics 11 to carry out sub-exposure to the exposed workpiece 15.

This allows the correction of proximity effect similar to the "GHOST exposure method" to be carried out without shading process of electron beam.

Next, the electron beam exposure method according to a preferred embodiment of the present invention will be explained while supplementing the operation of said apparatus. For example, when the stepped functions of both dose amount Q1 and Q2 are superposed on each other by two parameters (i) and (ii) as aforementioned for the auxiliary pattern shown in FIG. 5 to correct proximity effect similar to the "GHOST exposure method", control instruction is at first awaited in step P1.

For example, the start of exposure sequence is instructed through terminal unit 22, CPU 21 outputs switching control signal S1 to mode switcher 26. The main exposure data Dm and sub-exposure data Ds for one pattern of the desired LSI type are also read out from magnetic disk 23, transmit through interface 24 to buffer memory 25.

In said apparatus, electron beam EB may be most appropriately focused with object lens 11C based on focusing control signal S22, and driving control signal S6 may be output through interface 24 to stage driving system 13. This allows stage driving system 13 to drive stage 11D in the both X and Y directions, in order to move exposed workpiece 15 into the irradiatable area of electron beam EB.

Also, electron beam EB emitted from electron beam gun 11A is turned off by Blanking deflector 11B with blanking signal S21. For example, if signal S21="High" level, electron beam EB will be deflected somewhere away from its optical axis to block beam irradiation onto exposed workpiece 15.

Next, mode is switched in step P2. At this step, if exposure mode is main exposure mode (YES) then the process will proceed to step P3, and if exposure mode is sub-exposure mode (NO) then the process will proceed to step P8. More practically, either one of main or sub-exposure mode is selected by mode switcher 26 according to switching control signal S1 and exposure control signal S3.

In a preferred embodiment of the present invention, since main exposure mode is selected at first, main exposure data Dm, dose amount data Qe for main exposure, and pattern shift amount data D0 are read out at step P3. More practically, main exposure data Dm is read out from buffer memory 25 according to read-out request signal S4, and dose amount data Qe for main exposure and pattern shift amount data D0 are read out from correction coefficient memory 210. Data Qe is output to dose register 28, and data D0 to Shift accumulator 27.

Figure 5:
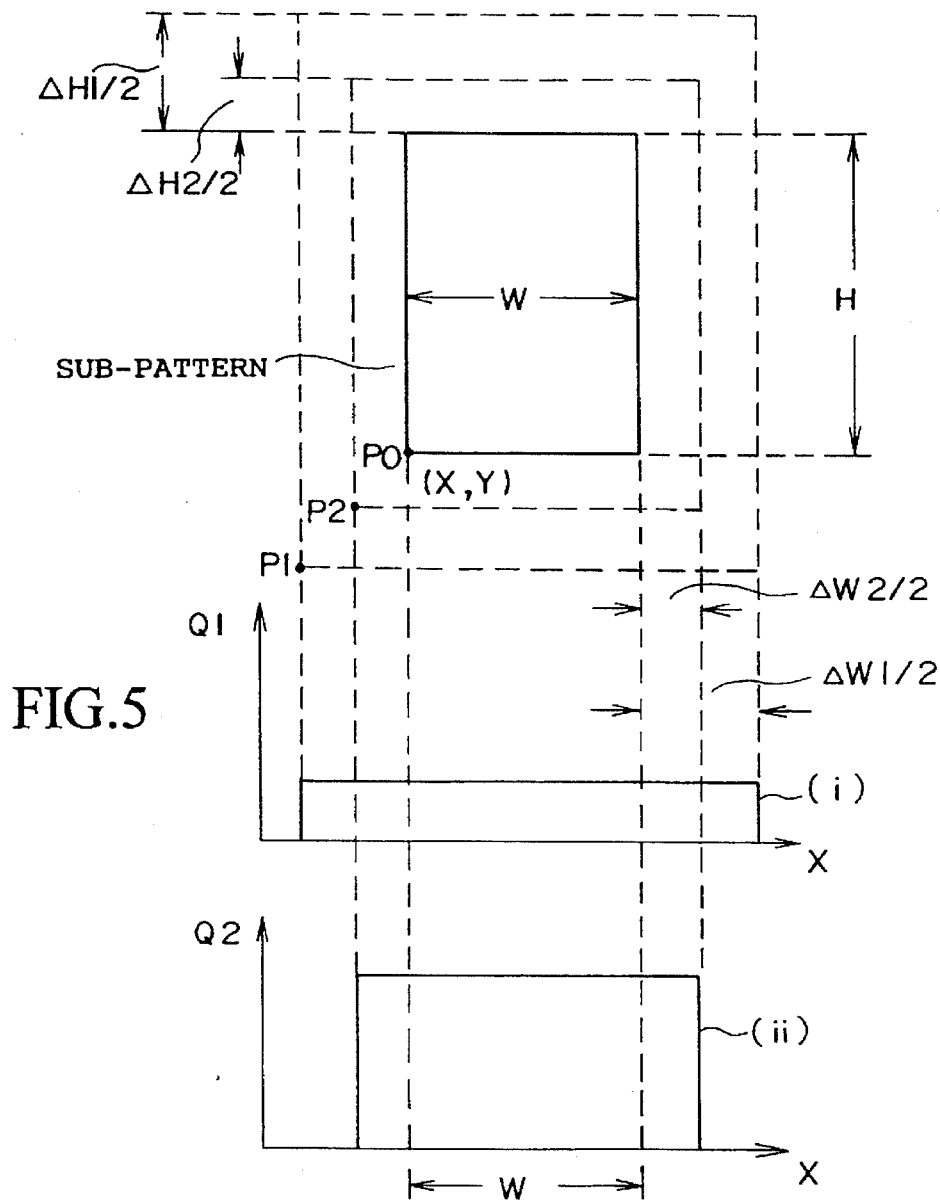
FIG. 5 is a schematic diagram illustrating the auxiliary pattern (height H×width W) and the distributional map of dose amount of the electron beam exposure apparatus shown in FIG. 3.

Then, in step P4, shift accumulation of main exposure data Dm with data D0 is carried out. As shown in FIG. 5, for main exposure, given the size of auxiliary pattern of height H and width W, the starting point coordinates p0 of electron beam EB will be $(X, Y)=(0, 0)$, and its shift amount data D0 will be $(H, W)=(0, 0)$. Therefore, for main exposure, D0="0" will be added to data Dm in Shift accumulator 27.

After that, in step P5, the shift-accumulated data Dm+D0 and dose amount data Qe are digital-to-analog converted. Here, the D/A converted signal of data Dm+D0 will be the deflection control signal, which provides the starting position of beam emission, and the D/A converted signal of data Qe will be the blanking signal, which determines the time period of beam emission.

By this, the main exposure to the exposed workpiece 15 is done in step P6. Here, by said deflection control signal and blanking signal S21, electron beam EB will be irradiated to the exposed workpiece 15 to be exposed. In practice, shots of electron beam EB are rectangularly divided.

After that, the termination of the exposure of all of Dm is verified in step P7. At this time, if the exposure is terminated (YES) then the process returns to step P1 to wait next control instruction. If the exposure of all of Dm is not yet terminated (NO) then the process go back to step P3 to continue processing from step P3 to step P6.

When the exposure of all of Dm is terminated, control instruction, i.e., sub-exposure instruction will be issued in step P1 so that sub-exposure mode will be selected in step P2 and the process will proceed to step P8.

That is, in steps P8 to P12, the exposure of sub-exposure mode by parameter (i) will be executed. For example, in step P8, sub-exposure data Ds, and dose amount data Q1 and pattern shift amount data D1 for sub-exposure are read out. More practically, according to read-out request signal S4, sub-exposure data Ds is read out from buffer memory 25, and dose amount data Q1 and pattern shift amount data D1 for sub-exposure are read out from correction coefficient memory 210. Data Q1 will be output to dose register 28 and data D1 to Shift accumulator 27.

Then, in step P9, shift accumulation of sub-exposure data Ds with data D1 is carried out. As shown in FIG. 5, for sub-exposure with parameter (i), the starting point coordinates p1 of electron beam EB will be $(X, Y)=(-\Delta W1/2, -\Delta H1/2)$, and the shift amount for this auxiliary pattern will be $(H, W)=(+\Delta W1, +\Delta H1)$. Therefore, for this sub-exposure, $D1="(-\Delta W1/2, -\Delta H1/2, +\Delta W1, +\Delta H1)"$ will be added to data Ds in Shift accumulator 27. In the distributional map of dose amount shown in FIG. 5, y-axis represents the dose amount Q1, and x-axis represents the position X.

After that, in step P10, the shift-accumulated data Ds+D1 and dose amount data Q1 are digital-to-analog converted. Here, the D/A converted signal of data Ds+D1 will be the deflection control signal, which provides the correction of the starting position of beam emission, and the D/A converted signal of data Q1 will be the blanking signal, which corrects the time period of beam emission.

By this, the sub-exposure to the exposed workpiece 15 is done in step P11. By said deflection control signal corrected with parameter (i) and blanking signal S21, electron beam EB will be irradiated to the exposed workpiece 15 to expose the reversal image area of the auxiliary pattern.

After that the termination of the correcting exposure is verified for each correction in step P12. At this time, if the exposure is terminated (YES) then the process proceeds to step P17. If the exposure is not terminated (NO) then the process proceeds to step P13.

When the sub-exposure for "parameter (i)" is terminated, the sub-exposure for "parameter (ii)" will be executed in steps P13 to P17. For example, in step P13, sub-exposure data Ds, and dose amount data Q2 and pattern shift amount data D2 for sub-exposure are read out.

In practice, according to read-out request signal S4, sub-exposure data Ds is read out from buffer memory 25, dose amount data Q2 and pattern shift amount data D2 for sub-exposure are read out are read out from correction coefficient memory 210. Data Q2 will be output to dose register 28 and data D2 to Shift accumulator 27.

Then, in step P14, shift accumulation of sub-exposure data Ds with data D1 is carried out. As shown in FIG. 5, for sub-exposure with parameter (ii), the starting point coordinates p1 of electron beam EB will be (X, Y)=(−ΔW2/2, −ΔH2/2), and the size of this auxiliary pattern will be (H, W)=(+ΔW2, +ΔH2). Therefore, for this sub-exposure, D2=" (−ΔW2/2, −ΔH2/2, +ΔW2, +ΔH2)" will be added to data Ds in Shift accumulator 27.

In the distributional map of dose amount for parameter (ii) shown in FIG. 5, y-axis represents the dose amount Q2, and x-axis represents the position X.

After that, in step P15, the shift-accumulated data Ds+D2 and dose amount data Q2 are digital-to-analog converted. Here, the D/A converted signal of data Ds+D2 will be the deflection control signal, which provides the correction of the starting position of beam emission, and the D/A converted signal of data Q2 will be the blanking signal, which corrects the time period of beam emission.

By this, the sub-exposure to the exposed workpiece 15 is done in step P16. By said deflection control signal corrected with parameter (ii) and blanking signal S21, electron beam EB will be irradiated to the exposed workpiece 15 to expose the reversal image area of the auxiliary pattern.

Since, in this preferred embodiment, there are two sub-exposure, the process proceeds to step P17 to verify the exposure termination. In this example, the order of exposures is Dm then Ds, and this means that all exposures for that LSI have been terminated. That is, this step P17 determines whether or not all exposures for that LSI have been terminated. If terminated (YES), the process terminates. If not (NO), the process returns to step P8 to execute sub-exposure with parameters (i) and (ii).

As mentioned above, in the method for electron beam exposure according to the preferred embodiment of the present invention, as shown in FIG. 4A, either one of main exposure mode or sub-exposure mode is selected in step P2, so that either in step P3 dose amount data Qe and pattern shift amount data D0 for main exposure or in steps P8 to P16 dose amount data Q1, Q2 and pattern shift amount data D1, D2 for sub-exposure are read out.

Therefore, since the deflection of electron beam EB is controlled based on different set of data Q1, D1, Q2, D2 selected in the sub-exposure mode, the beam energy distribution represented by Gaussian distribution which is required for sub-exposure may be approximated by superposing the graded (stepped) function obtained from that set of exposures (beam energy).

Figure 6:
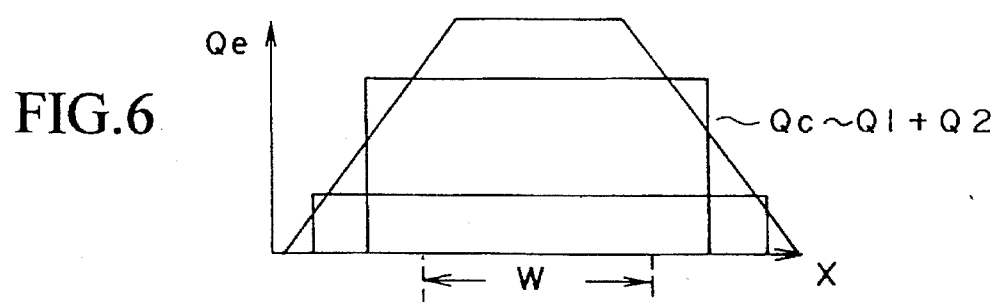
FIG. 6 is a schematic diagram illustrating the distributional map of beam energy of the electron beam exposure apparatus shown in FIG. 3.

That is, on the dose amount Qe for the auxiliary pattern as shown in FIG. 5, the stepped functions of dose amounts Q1 and Q2 from two parameters (i) and (ii) are superposed as shown in FIG. 6, so that the proximity effect correction similar to "GHOST exposure method" may be carried out.

By this, pattern exposure is processed by using electron beam EB registered to the most appropriate focus (just focus) of the electron beam optics 11 based on the control parameters settled at first. Additionally, since adjustment of control parameters is not required at the time of mode switching, high speed exposure process and stable exposure process for high precision device pattern may be achieved. Also, production yields may be improved.

In the preferred embodiment of the present invention, although the sub-exposure for two parameters, (i) and (ii) has been explained, proximity effect correction more similar to "GHOST exposure method" may be achieved by using more than two parameters.

What is claimed is:

1. An electron beam exposure apparatus for forming a desired pattern on an object to be exposed by irradiating electron beams to said object, comprising:

storing means for storing various data including:
      first location data indicating a location of said desired pattern on said object,
      parameters used to generate second location data from the first location data, said second location data indicating a location of a two-dimensionally enlarged pattern of said desired pattern on said object,
      first dose amount data used to set an irradiation amount of said electron beams for exposing said desired pattern on said object, and
      second dose amount data used to set an irradiation amount of said electron beams for exposing said enlarged pattern on said object;
   controlling means for generating a first irradiating signal based on the first location data stored in the storing means and the first dose amount data, said controlling means further generating a second irradiating signal based on the second dose amount data and the second location data which have been obtained by applying said parameters to said first location data; and
   electron beam irradiating means for exposing said exposed object in compliance with said first and second irradiating signals supplied from said controlling means.

2. An electron beam exposure apparatus according to claim 1, further comprising:
   means for selecting one of main exposure mode for exposing said desired pattern and sub-exposure mode to correct proximity effect in said desired pattern; and means for reading said first location data of said desired pattern and said first dose amount data from said storing means in response to selection of said main exposure mode, and reading said first location data of said desired pattern, said parameters, and said second dose amount data from said storing means in response to selection of said sub-exposure mode.

3. An electron beam exposure apparatus according to claim 1, wherein said controlling means generates a third irradiating signal to irradiate said electron beam to an entire area of said enlarged pattern including said desired pattern, based on said first location data of said desired pattern, said second location data of said enlarged pattern, and said second dose amount data.

4. An electron beam exposure apparatus according to claim 1, wherein said controlling means generates a fourth irradiating signal to irradiate said electron beam to an area of said enlarged pattern excluding said desired pattern, based on said first location data of said desired pattern, said second location data of said enlarged pattern, and said second dose amount data.

5. An electron beam exposure apparatus according to claim 1, wherein an irradiation amount of said electron beam to expose said enlarged pattern is set lower than an irradiation amount of said electron beam to expose said desired pattern.

* * * * *